United States Patent

Guadagnolo

[15] 3,686,516

[45] Aug. 22, 1972

[54] HIGH VOLTAGE PULSE GENERATOR

[72] Inventor: Robert Noel Guadagnolo, Alhambra, Calif.

[73] Assignee: RCA Corporation

[22] Filed: Jan. 15, 1971

[21] Appl. No.: 106,676

[52] U.S. Cl. ..................307/263, 307/264, 307/268, 307/283, 307/302

[51] Int. Cl. ............................H03k 3/12, H03k 5/00

[58] Field of Search......307/260, 263, 264, 268, 283, 307/302; 328/59, 60, 61, 67, 156, 157

[56] References Cited

UNITED STATES PATENTS

| | | | |
|---|---|---|---|
| 3,371,252 | 2/1968 | James | 307/283 X |
| 3,268,822 | 8/1966 | Hickey | 307/302 X |
| 3,331,968 | 7/1967 | Hickey | 307/302 X |
| 3,337,755 | 8/1967 | Grabowski et al. | 328/67 X |
| 3,154,721 | 10/1964 | Sommeria | 328/157 X |
| 3,274,397 | 9/1966 | Heckman et al. | 307/268 X |

*Primary Examiner*—Stanley D. Miller, Jr.
*Attorney*—Edward J. Norton

[57] ABSTRACT

A high power, fast rise time pulse is provided by a pulse generator in which a first circuit provides a relatively narrow, high peak power pulse and a second circuit provides a relatively wide, lower peak power pulse, the two pulses being combined to form a single pulse.

1 Claim, 3 Drawing Figures

Inventor:
ROBERT N. GUADAGNOLO
By William Squire
Attorney

HIGH VOLTAGE PULSE GENERATOR

BACKGROUND OF THE INVENTION

This invention relates to pulse generators, and more particularly, to circuits which provide high voltage, short rise time pulses.

Presently, pulse generators capable of generating pulses characterized by short rise time and high voltages using semiconductor switching devices are limited by the characteristics of the individual devices in the circuits. These characteristic limitations fall generally in the area of providing (i) high speed, (ii) wide bandwidth, (iii) high current and (iv) high voltage capabilities. That is, in present known devices there is a conflict of characteristics in a device which prevents providing high speed, extremely wide bandwidths, for example, from dc to the megacycles range, as well as providing high current at high voltages. Usually, semiconductor devices or transistors or the like, if provided with high speed characteristics are not capable of sustaining high voltages. In fact, in special instances, transistors are gold doped to provide very high switching speed. However, this gold doping severely limits the voltage capability of a device. On the other hand, devices which are capable of high voltages and high current are accompanied by relatively slow switching speeds in which the delay and storage times substantially increase with the voltage requirements.

To provide a high speed, wide bandwidth, and a high voltage generator, prior art circuits usually have a plurality of stages, each stage having low voltage transistors. Thus, for example, devices such as 50 volt transistors having rise times in the 40–50 nanosecond range must be coupled in a large number of stages in order to get a higher voltage capability. That means for 1,000 volt capability, 20 such stages need to be used. When employing 20 stages, however, increased complexity is manifested. Each stage requires driving circuits and biasing circuits which add to the number of components and increases the cost thereof. Certain applications such as pulsed lasers, optical modulators, CRT deflection circuits, or microwave tube modulation require these high voltages having nanosecond rise times and thus, pulse generators for these applications have proved to be complex and costly.

A particular problem associated with these latter applications is that the loads usually require nanosecond high voltage pulses having high power capabilities. Such loads usually include stray capacitance which is present in most circuits. To drive such a load, the capacitance that exists therein is charged first. The requirement that stray capacitance in a load be pulsed with nanosecond rise time pulses has resulted in pulse generators which are relatively complex and costly when employing semiconductor devices.

SUMMARY OF THE INVENTION

In accordance with the present invention a pulse generator having an input terminal for connection to a high voltage source and an output terminal for connection to a load includes first means coupled to the input terminal for generating in response to a first trigger signal applied thereto a relatively narrow high voltage, high peak power pulse, the leading edge of which has a short rise time. Second means are coupled to the input terminal of the pulse generator for generating in response to a second trigger signal applied thereto a relatively wide high voltage pulse having a leading edge rise time substantially greater than the narrow pulse leading edge rise time and of substantially less peak power than the narrow pulse. Trigger means are coupled to the first and second means for applying the signals to the first and second means. The leading edge of the wide pulse applied to the output terminal from the second means is formed during the period of the narrow pulse applied to the output terminal from the first means, whereby any stray capacitance appearing at the output terminal of the pulse generator is rapidly charged. The relatively narrow high voltage high peak power pulse which has a short rise time leading edge provides the power for charging the stray capacitance which may be present in a given load. The second means provides a relatively wide pulse which can be a DC level for powering the load in an operating mode.

DETAILED DESCRIPTION

Figure 1:
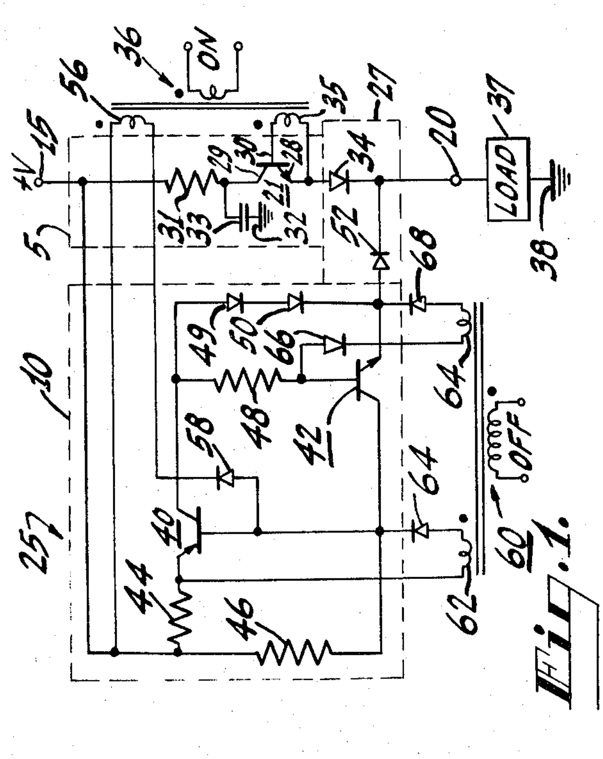
FIG. 1 is a schematic illustration of a circuit embodying the present invention.

Pulse generator 25 of FIG. 1 includes a first portion 5 coupled between input terminal 15 and an output terminal 20 for generating in response to a trigger signal applied thereto a relatively narrow high voltage, high peak power pulse, the leading edge of which has a short rise time. A second portion 10 of generator 25 is also coupled between input terminal 15 and output terminals 20 in parallel with portion 5 for generating in response to a trigger signal applied thereto a relatively wide, high voltage pulse having a leading edge rise time substantially greater than the narrow pulse lading edge rise time and of substantially less peak power than the narrow pulse. A high voltage source (not shown) is connected to terminal 15.

The two separate, but parallel circuit portions 5 and 10 of pulse generator 25 each provide separate portions of the desired pulse to be applied to output terminal 20. Combining means 27 combines the individual pulses of both portions 5 and 10 and applies them to terminal 20.

In effect, instead of providing a single circuit which must meet both bandwidth, rise time and voltage requirements of a load, the present invention divides the pulse requirement into two portions. The first portion 5 provides the high power and narrow pulse requirement necessary to charge up any stray capacitance that would exist in a given load. At the same time while portion 5 has already generated the very narrow high powered pulse, the second portion 10 is in the process of turning on to generate a relatively wider pulse having greater rise time, but less peak power than the pulse generated by portion 5. What the load sees is a single pulse, but this single pulse comprises two portions having their origin in separate circuits. As a result of this unique configuration, fewer low cost semiconductor devices may be utilized to generate the desired pulse at output 20 than otherwise possible. This results in substantial savings of added components which would be otherwise necessary in a single composite circuit which meet all the load requirements noted above.

Another unique feature of the present invention is that each portion 5 and 10 may be separately stacked in serial arrangement between a source terminal 15 and a load terminal 20 in various pluralities to provide any particular desired voltage power capability. For example, three, four, or five, or any number of portions 5 may be serially connected between terminal 15 and 20 and independent of the number of portions 10. Three, four or five or any number of portions 10 may be serially connected between terminal 15 and terminal 20 across portion or portions 5. Thus, although various components used in portions 5 and 10 ideally may have similar characteristics, in practice, the voltage characteristics are not exactly alike so that a different number of portions 5 may be combined with another different number of portions 10 thereacross. Thus, a large degree of flexibility is permitted in the circuit of the present invention which provides for matching voltage characteristics of portions 5 and 10.

Referring to FIG. 1, portion 5 includes an avalanche transistor 21 having an emitter electrode 28, a collector electrode 29, and a base electrode 30 characterized by a relatively low collector-base leakage current. Collector 29 is connected to terminal 15 through load resistor 31 and to system ground terminal 32 through capacitor 33. Emitter electrode 28 is connected to system ground terminal 38 through diode 34 and terminal 20. Diode 34 is poled to allow normal current to flow from the emitter to terminal 20. Base electrode 30 is coupled to emitter electrode 28 through coil 35 of transformer 36 which provides an on pulse through coil 35 to start transistor 21 avalanching.

Transistor 21, as indicated above, is a transistor whose operation is in the avalanche mode. This mode is provided when a high voltage is present across the emitter-collector path and the base electrode is given a short duration pulse. The transistor will continue to avalanche until the potential across the collector-emitter path equalizes. At this time the transistor will cease to conduct, providing latch-up conditions are not present. Operating in the avalanche mode produces a pulse the leading edge of which has a very short rise time and at the same time the transistor is capable of dissipating large power levels. This permits high current and voltages to be rapidly switched to load 37. A transistor of the avalanche type, due to its power dissipation, is not capable of sustaining long pulses, and therefore, ordinarily would not be useful by itself to power a load having wide pulse width requirements, e.g. 200 nanoseconds to D.C. Therefore, this avalanche transistor is used in portion 5 in a manner to which the transistor is most suited.

Terminal 15 is connected to a high voltage source, (not shown) through relatively large load resistor 31 to provide a relatively low current (less than the minimum avalanche current of transistor 21) to collector 29 of transistor 21 to prevent unwanted current leakage through transistor 21 and to prevent latch up of transistor 21. Capacitor 33 is a storage capacitor, which, when transistor 21 is triggered to the avalanche mode, the charge in capacitor 33 is immediately discharged through transistor 21 and through diode 34 to load 37, providing a relatively narrow, high rise time, high peak power pulse.

In operation of portion 5, capacitor 33 is charged through resistor 31, while transistor 21 is in the off state. Transformer 36 is then caused to momentarily pulse on transistor 21, which momentarily forward biases transistor 21, causing transistor 21 to operate in the avalanche mode and which causes instantaneous discharge of capacitor 33 to load 37. Once the potential across electrodes 28 and 29 equalizes transistor 21 cuts off. The short, narrow pulse produced by portion 5 has sufficient power to charge any stray capacitance which may be present in load 37. As will be shown, transistor 21 may be connected with other similar transistors in a serial arrangement to handle even higher voltages and higher power requirements than that of a single transistor.

Now turning to portion 10, portion 10 provides the pulse body of the pulses generated by generator 25. That is, the width of the pulse, after the initial narrow pulse provided by the transistor 21 terminates, is provided by portion 10. Portion 10 is a regenerative stage including a PNP transistor 40 and an NPN transistor 42. The emitter electrode of transistor 40 is connected to terminal 15 through resistor 44 and to the collector electrode of transistor 42 through resistor 46. The base electrode of transistor 42 is connected to the collector electrode of transistor 40 through resistor 48.

The collector and emitter electrodes of transistors 40 and 42, respectively, are coupled by diodes 49 and 50 which are poled to pass normal current from the collector of transistor 40 to the emitter of transistor 42. The junction of emitter electrode of transistor 42 and diode 50 is coupled to terminal 20 through diode 52 which is poled to pass current from transistor 42 to terminal 20.

The junction of resistors 44 and 46 is coupled to the base of transistor 40 through coil 56 of transformer 36 and diode 58. Diode 58 has its anode coupled to the base of transistor 40 and its cathode coupled to coil 56 of on pulse transformer 36. Coil 62 of off pulse transformer 60 is coupled to the emitter of transistor 40 and to base of transistor 40, the latter connection being through diode 64 whose anode is coupled to coil 62. A second coil 64 of transformer 60 is coupled through diode 66 to the base of transistor 42 and through diode 68 to the junction of diode 52 and the emitter of transistor 42. Diode 66 has its cathode coupled to coil 64 and diode 68 has its anode coupled to coil 64.

The operation of portion 10 will now be explained. Portion 10, once triggered on, operates in a regenerative mode. With an on pulse from transformer 36, the base of transistor 40 goes negative through diode 58. This causes transistor 40 to conduct, the base being more negative than the emitter. Current at the collector of transistor 40 divides through resistor 48 and through diode pair 49 and 50. The current through resistor 48 makes the base of transistor 42 positive with respect to the collector-emitter path, biasing transistor 42 on. The current flowing through the emitter of transistor 42 combines with the current flowing through diode 49 and 50, and passes through diode 52 to load 37 at terminal 20. Diode pair 49 and 50 are provided to permit transistor 42 to turn on. With transistor 42 conducting, a voltage drop appears across resistor 46. This voltage drop tends to make the emitter of transistor 40 more positive with respect to the base and thus causes more current to flow through transistor 40. This cycle continues in the regenerative mode producing what is hereinafter called the pulse body of the pulse output of generator 25. The pulse body may have a width of any desired length which is a function of the desired application of the pulse output.

Figure 3:
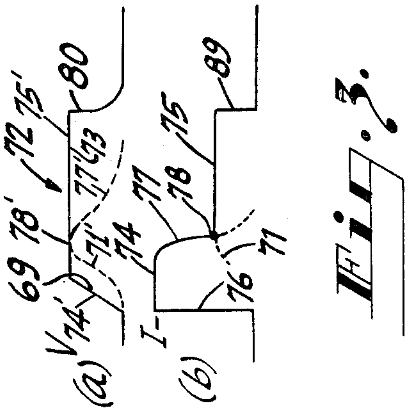
FIG. 3 is a series of waveforms useful in the description of FIGS. 1 and 2.

To further illustrate the relationship between the pulses generated by portions 5 and 10, reference is made to FIGS. 3*a* and 3*b* which reveal some of the voltage and current waveform characteristics. In FIG. 3*a*, voltage pulse 72 is formed by generator 25 at output terminal 20. Pulse 72 includes two separate pulses 74′ and 75′ which are combined by means 27 into a single pulse waveform. Pulse 74′ is formed by portion 5 and pulse 75′ is formed by portion 10. Pulse 74′ has a leading edge 69 and a lagging edge 77′. The rise time of leading edge 69 may be in the order of 20–40 ns. During the period of pulse 74′, portion 10 is turning on and forming pulse 75′, which has a leading edge 71′ and a lagging edge 80. Cross over point 78′ between pulses 74′ and 75′ occurs when portion 5 ceases conducting through diode 34 and portion 10 commences to conduct through diode 52. Since pulse width 73 may be in the order of 200 ns or greater, to DC, it can be seen that portion 5 provides the leading edge 69 of pulse 75′ while portion 10 provides the pulse body 73. The peak power of pulse 74′ is greater than the peak power of pulse 75′ as will be apparent in the following discussion of the current waveform of FIG. 3*b*.

In FIG. 3*b*, current pulse 74 is generated by portion 5 and current pulse 75 is generated by portion 10 of generator 25. Pulse 74 corresponds to pulse 74′ and pulse 75 corresponds to pulse 75′ of FIG. 3*a*. Pulse 74 has a leading edge 76 and a lagging edge 77. The rise time of leading edge 76 may be in the order of 5ns, followed by a constant current for approximately 40–50 ns. Pulse 75 is being formed during the period of pulse 74 at which time leading edge 71 occurs. Edge 71 crosses lagging edge 77 at crossover point 78 and continues until pulse 75 is cut off forming lagging edge 89. The peak power of pulse 74 is significantly greater than the peak power of pulse 75 in that the current of pulse 74 may have a magnitude of 4–5 amps while the current of pulse 75 may be in the order of 100 milliamps. It is readily seen that the power provided by current pulse 74 when voltage pulse 74′ is still turning on is greater than the peak power of current pulse 75. Pulse 75 is characterized by approximately 50 ns rise time which occurs during the interval of pulse 74. As a result, pulse 75 is in combination with pulse 74 provides a pulse having high initial peak power when the power is needed by a load, fast rise times and wide lattitudes and bandwidth.

Lagging edges 77 and 77′ occur when capacitor 33 is discharged through diode 34 to load 37 cutting off transistor 21. When load 37 is drawing current through portion 5 there is no drawing of current from portion 10 by the load. When the crossover point 78 between pulses 74 and 75 is reached, the load commences to draw current from portion 10. At this time portion 10 commences conducting through diode 52, at which time the current thereafter remains constant until regenerative stage 10 cuts off.

To provide lagging edge 80 of the voltage curve of FIG. 3*a* or edge 89 of the current curve of FIG. 3*b* an off trigger pulse is provided. Transformer 60 provides such an off pulse. Since portion 5 including the avalanche transistor 21 automatically turns itself off, no pulse is required thereto for driving that portion off. However, transformer 60 provides the pulse to turn the regenerative stage 10 off. In essence, a positive pulse is provided to the base of transistor 40 which makes the base thereof more positive with respect to the emitter and cuts the transistor off. Since transistor 40 and 42 are in the regenerative operating mode, cutting off one of the transistors will cut off both transistors. As an additional aid in cutting off portion 10, a second pulse is applied to the base of transistor 42. This provides a negative potential to the base 42 and cuts off transistor 42 at the same time that transistor 40 is being out off. In a similar manner, either of transistors 40 or 42 may be solely pulsed into the off condition to cut off regenerative portion 10.

Transformer 36 biases on both portions 5 and portions 10. However, since portion 5 can be operated independent of portion 10, separate trigger circuits may be provided, as will be shown, to each of portions 5 and 10. It is preferable that both portions be turned on at the same time, but turn on of portion 5 initially and then portion 10 before portion 5 ceases to conduct or cuts off will also permit operation in the manner described.

Figure 2:
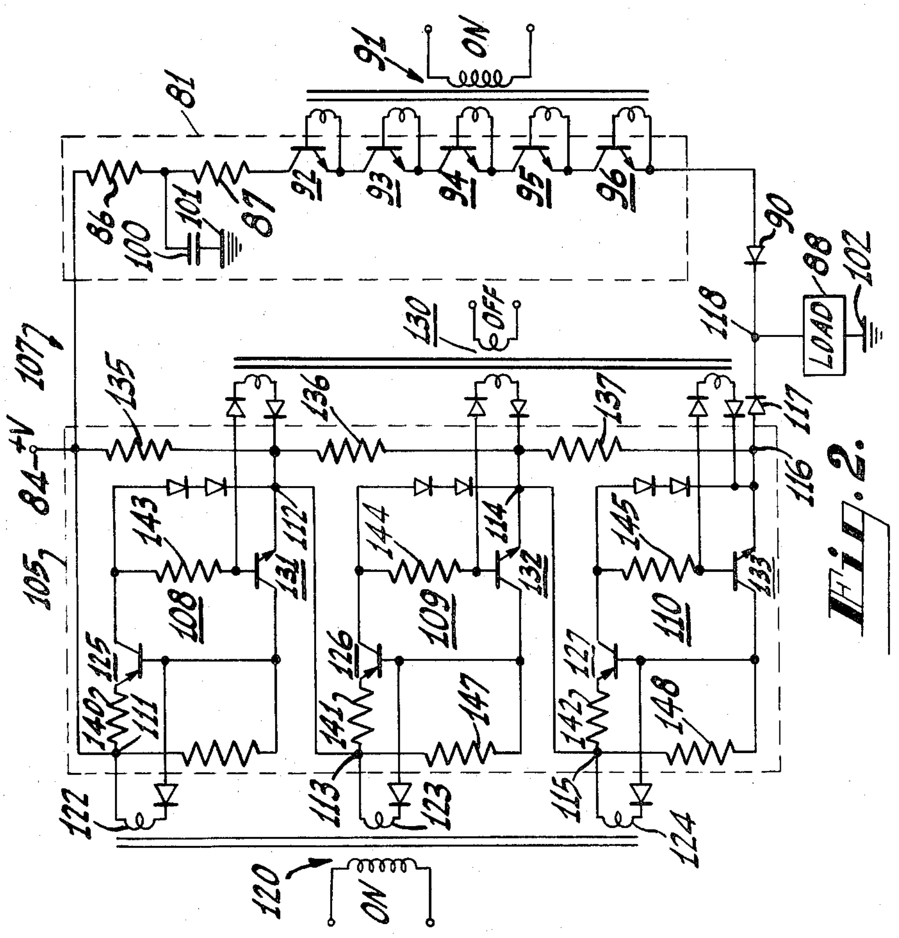
FIG. 2 is a further schematic of the present invention illustrating the flexibility of the various pulse producing portions of the generator.

The embodiment of FIG. 2, like that of FIG. 1, includes two portions 81 and 105. Portion 81 generates a relatively narrow high voltage high peak power pulse the leading edge of which has a short rise time and is similar to portiOn 5 of FIG. 1 with respect to its mode of operation. Instead of a single transistor, there is here provided five transistors, 92–96 inclusive, each having its emitter electrode coupled to the collector electrode of the next adjacent transistor. Transistor 92 has its collector electrode collected to source terminal 84 through current limiting resistor 87 and load resistor 86. Transistor 96 has its emitter electrode coupled to system ground terminal 102 through diode 90 and load 88. Transformer 91, which provides an on pulse to portion 81, is coupled to the base and emitter electrode of each avalanche transistor 92 through 96 similarly as that shown for the coupling of transformer 36 to avalanche transistor 21 of FIG. 1. Storage capacitor 100 is coupled to the junction of resistors 86 and 87 and system ground terminal 101.

When a high voltage, such as 1000 volts, is applied to terminal 84 by voltage source (not shown), capacitor 100 stores up a charge therein through resistor 86. To provide a 1000 volt standoff voltage across terminals 84 and 102, a number of transistors in the avalanche mode have been found, in practice, to be satisfactory, each transistor being capable of handling approximately 200 volts and 500 watts dissipation power. Consequently, to provide 1000 volts capability, five transistors were selected.

Current limiting resistor 87 prevents excessive power dissipation by transistors 92 through 96. When a pulse is simultaneously provided by transformer 91 to each of the respective base electrodes of transistors 92–96, these transistors commence operation in the avalanche mode discharging capacitor 100 through diode 90 which is poled to conduct normal current flow from terminal 84 to load 88 and charge any stray capacitance which may be present in the load 88. Portion 81 provides leading edge 69 of pulse 74' of FIG. 3*a* and leading edge 76 of pulse 74 of FIG. 3*b*.

Portion 105 is the regenerative stage of generator 107, which portion functions in a similar manner as that of portion 10 of generator 25 of FIG. 1. Portion 105 consists of three stages, each stage being identical in arrangement as that of portion 10. In this case, however, the output terminal of each stage is connected to the input terminal of the next succeeding stage. That is, stage 108 is coupled to stage 109 which in turn is coupled to stage 110. Input terminal 111 of stage 108 is coupled to source terminal 84. Output terminal 112 of stage 108 is connected to input terminal 113 of stage 109 while output terminal 114 of stage 109 is connected to input terminal 115 of stage 110. Output terminal 116 of stage 110 is coupled to load 88 through diode 117 which is poled to permit normal current flow from output terminal 116 of stage 110 to output terminal 118 of generator 107.

To trigger portion 105 to the on condition, transformer 120 coils, 122, 123 and 124 are each respectively coupled to PNP transistors 125, 126 and 127 respectively. Means (not shown) are used to cause transformer 120 to pulse the respective stages to the on condition. Transformer 130, which pulses the respective stages to the off condition, is coupled to each of NPN transistors 131, 132 and 133 in a manner similar as transformer 60 was coupled to transistor 42 of FIG. 1. Means (not shown) cause transformer 130 to generate an off pulse which simultaneously turns off each of stages 108, 109 and 110. No transformer on pulse coupling is shown to the transistors 125, 126 and 127 since, as indicated above, only one of the transistors of the two transistors of each stage need be pulsed on to cause the stages to operate in their regenerative mode.

Coupled between input terminal 84 of generator 107 and output terminal 118 are resistors 135, 136 and 137 which are serially connected to each other. Each resistor is respectively coupled across a different one of stages 108, 109 and 110 as illustrated in FIG. 2. Resistors 135 through 137 serve as a voltage divider to equalize the voltage across each of stages 108, 109 and 110. Diodes 90 and 117 combine pulses 74 and 74' with pulses 75 and 75', respectively, the discussion of the waveforms of FIG. 3 applying equally to generator 107. In generator 107, separate turn on transformers 91 and 120 are provided for portions 81 and 105, respectively. In practice, the currents and voltages noted above were obtained from a generator constructed in accordance with generator 107 of FIG. 2.

Not shown in FIG. 2 are capacitors and resistors which may be across each of transistors 92–96 for equalizing transient voltages which appear thereacross. Resistor 86 is a load resistor which is a relatively high valued resistor which provides a low current to the avalanche transistors 92–96. This low current should be less than the minimum avalanche current for transistors 92–96, to permit these transistors to turn off. The charge stored in capacitor 100 is much greater than the energy required to charge the stray capacitance present in load 88. In effect, transistors 92–96 provide a very low impedance path to the load and, from a practical point of view, provide a rapid equalization of charge on capacitor 100 and the load capacitance. Resistor 86 is sufficiently large that even if the load were purely resistive the current through resistor 86 would be sufficiently low to prevent latching on of the avalanche transistors.

Generator 107 of FIG. 2 is illustrated having five avalanche transistors in portion 81 and three regenerative stages in portion 105. It has been found that to provide a predetermined standoff voltage across terminals 84 and 102, the number of regenerative stages 105 coupled in series may differ from the number of avalanche transistors due to the different characteristics of the transistors which comprise portions 81 and 105. In practice, selection of individual transistors having certain predetermined voltage bandwidth, and power handling capabilities corresponding to the requirements of each of portions 105 and 18 results in the selection of the desired number of these components in each of portions 105 and 81. For example, five avalanche transistors are employed to provide 1000 volt standoff voltage which correspond to three regenerative stages utilizing the specific components of FIG. 2. In a typical construction of the embodiment of FIG. 2, the following components are utilized:

| | |
|---|---|
| Transistors **92–96** | NS2353 (Manufactured by National Semiconductor Corporation) |
| Transistors **125, 126**, and **127** | 2N5416 |
| Transistors **131–133** | 2N3439 |
| Diodes **117** and **90** | 1N4739 |
| All other diodes LN914 | |
| Resistor **86** | 300K ohms |
| Resistor **87** | 180 ohms |
| Resistors **141–142** | 12 ohms each |
| Resistors **143–145** | 470 ohms each |
| Resistors **135–137** | 100K ohms each |
| Capacitor **100** | 150 pico farads |

Thus, the present invention provides a pulse generator which is capable of high speed, wide bandwidth, high initial power requirement, and high sustaining voltage. This arrangement provides in a semiconductor apparatus a ten to one reduction in size as compared to prior art circuits. Further, this arrangement provides a floating potential since there is no ground reference potential necessary. In the present invention, turn on delay time is 10 nanoseconds while rise time is approximately 30 nanoseconds. Thus there is provided a 40 nanosecond delay plus rise time pulse. The repetition rate of the circuit according to the present invention is limited not by the charging time of the capacitor 100, but by the power dissipation capabilities of the avalanche transistors. That is, the capacitor 100 can be recharged at a frequency of 2 megacycles, but yet, the power dissipation of avalanche transistors 92–96 limit the repetition rate to 50 killohertz or less.

What is claimed is:

1. A pulse generator having an input terminal for connection to a high voltage source and an output terminal for connection to a load comprising, a first transistor operable in an avalanche mode and having base, emitter and collector electrodes, means connecting said collector to said input terminal and said emitter to said output terminal, a capacitor connected between said collector and a point of reference potential in a manner to be charged from said source, a PNP transistor and an NPN transistor connected in a regenerative circuit between said input terminal and said output terminal, means coupled to said base electrode for triggering said first transistor into said avalanche mode to discharge said capacitor to said output terminal providing at said output terminal a narrow, high current, high peak power pulse, and means coupled to said PNP and NPN transistors for causing said PNP and NPN transistors to regeneratively produce at said output terminal a second pulse having a rise time occuring during the time of said first pulse of less peak power than said first pulse, and of a longer duration than that of said first pulse.

* * * * *